(12) United States Patent
Li et al.

(10) Patent No.: US 10,755,769 B2
(45) Date of Patent: Aug. 25, 2020

(54) CARBON NANOTUBE TERNARY SRAM CELL WITH IMPROVED STABILITY AND LOW STANDBY POWER

(71) Applicant: Wenzhou University, Zhejiang (CN)

(72) Inventors: Gang Li, Zhejiang (CN); Pengjun Wang, Zhejiang (CN); Yuejun Zhang, Zhejiang (CN); Bo Chen, Zhejiang (CN)

(73) Assignee: Wenzhou University, Zhejiang (CN)

( * ) Notice: Subject to any disclaimer, the term of this patent is extended or adjusted under 35 U.S.C. 154(b) by 0 days.

(21) Appl. No.: 16/403,637

(22) Filed: May 6, 2019

(65) Prior Publication Data

US 2019/0341100 A1 Nov. 7, 2019

(30) Foreign Application Priority Data

May 7, 2018 (CN) .......................... 2018 1 0425450

(51) Int. Cl.
| | |
|---|---|
| *G11C 11/419* | (2006.01) |
| *G11C 11/412* | (2006.01) |
| *G11C 11/417* | (2006.01) |
| *G11C 11/418* | (2006.01) |
| *G11C 11/56* | (2006.01) |
| *H01L 27/28* | (2006.01) |

(52) U.S. Cl.
CPC .......... *G11C 11/412* (2013.01); *G11C 11/417* (2013.01); *G11C 11/418* (2013.01); *G11C 11/419* (2013.01); *G11C 11/56* (2013.01); *H01L 27/283* (2013.01)

(58) Field of Classification Search
CPC ... G11C 11/412; G11C 11/417; G11C 11/418; G11C 11/419
USPC ........................................................ 365/156
See application file for complete search history.

(56) References Cited

U.S. PATENT DOCUMENTS

2018/0182450 A1* 6/2018 Wang ....................... G11C 8/10

OTHER PUBLICATIONS

Lin et al., "Design of a Ternary Memory Cell Using CNTFETs", IEEE Transactions on Nanotechnology, Aug. 3, 2012, pp. 1019-1025.

(Continued)

*Primary Examiner* — Xiaochun L Chen
(74) *Attorney, Agent, or Firm* — JCIP Global Inc.

(57) ABSTRACT

A carbon nanotube ternary SRAM cell with an improved stability and low standby power comprises a write bit line, a read bit line, a column select bit line, an inverted column select bit line, a write word line, an inverted write word line, a read word line, an inverted read word line, a first P-type CNFET, a second P-type CNFET, a third P-type CNFET, a fourth P-type CNFET, a fifth P-type CNFET, a sixth P-type CNFET, a seventh P-type CNFET, an eighth P-type CNFET, a ninth P-type CNFET, a first N-type CNFET, a second N-type CNFET, a third N-type CNFET, a fourth N-type CNFET, a fifth N-type CNFET, a sixth N-type CNFET, a seventh CNFET, an eighth N-type CNFET and a ninth N-type CNFET. The carbon nanotube ternary SRAM cell has the advantages of being lower in power consumption, capable of solving the half-select problem and the read-disturb problem and high in static noise margin.

2 Claims, 6 Drawing Sheets

(56) References Cited

OTHER PUBLICATIONS

Ghanatghestani et al., "Design of a Low-Standby Power and High-Speed Ternary Memory Cell Based on Carbon Nanotube Field-Effect Transistor", Journal of Computational and Theoretical Nanoscience, Dec. 2015, pp. 5457-5462.
Prabhu et al., "Low-power fast (LPF) SRAM cell for write/read operation", IEICE Electron. Express, Sep. 25, 2011, pp. 1473-1478.
Kamar et al., "Noise Margin-Optimized Ternary CMOS SRAM Delay and Sizing Characteristics", IEEE, Aug. 2010, pp. 801-804.

* cited by examiner

US 10,755,769 B2

CARBON NANOTUBE TERNARY SRAM CELL WITH IMPROVED STABILITY AND LOW STANDBY POWER

CROSS-REFERENCE TO RELATED APPLICATION

This application claims the priority benefit of China application serial no. 201810425450.3, filed on May 7, 2018. The entirety of the above-mentioned patent application is hereby incorporated by reference herein and made a part of this specification.

TECHNICAL FIELD

The invention relates to a ternary SRAM cell, in particular to a carbon nanotube ternary SRAM cell with an improved stability and low standby power.

DESCRIPTION OF RELATED ART

As carbon nanotube field effect transistors (CNFETs) have an adjustable threshold as well as an on/off current higher than that of MOSFETs, the leakage power of a memory circuit adopting CNFETs is much lower than that of a memory circuit adopting MOSFETs. For this reason, CNFETs are widely applied to the field of memory circuit design.

Ternary static random access memories (SRAMs) can store three digital states '0', '1' and '2' and are able to effectively improve the memory capacity over binary SRAMs. There are nowadays two typical ternary SRAM cells implemented by CNFETs: a traditional ternary SRAM cell disclosed in Document 1 (Lin S, Kim Y B, Lombardi F., Design of a ternary memory cell using CNTFETs. IEEE Trans Nanotechnology, 2012, 11(5): 1019) shown in FIG. 1 as well as a novel ternary SRAM cell disclosed in Document 2 (Ghanatghestani M M, Pedram H, Ghavami B., Design of a low-standby power and high-speed ternary memory cell based on carbon nanotube field-effect transistor. J Computational & Theoretical Nanoscience, 2015, 12(12): 5457) shown in FIG. 2. In spite of the good performance, these two ternary SRAM cells still have the following drawbacks: first, when logic '1' is stored, the two ternary SRAM cells both have two DC paths (from power supply VDD to the ground), which results in a considerable DC power loss; second, because of the half-select problem of the two ternary SRAM cells, the memory nodes of the cells within the unselected column in the selected word line are directly affected by the state of a write bit line; and third, because of the read-disturb problem, the novel ternary SRAM cell has a low static noise margin (SNM) and poor stability.

BRIEF SUMMARY OF THE INVENTION

The technical issue to be settled by the invention is to provide a carbon nanotube ternary SRAM cell with an improved stability and low standby power to fulfill a low power loss and high static noise margin and to solve the half-select problem and the read-disturb problem.

The technical solution adopted by the invention to settle the above technical issue is as follows: a carbon nanotube ternary SRAM cell with an improved stability and low standby power comprises a write bit line, a read bit line, a column select bit line, an inverted column select bit line, a write word line, an inverted write word line, a read word line, an inverted read word line, a first P-type CNFET, a second P-type CNFET, a third P-type CNFET, a fourth P-type CNFET, a fifth P-type CNFET, a sixth P-type CNFET, a seventh P-type CNFET, an eighth P-type CNFET, a ninth P-type CNFET, a first N-type CNFET, a second N-type CNFET, a third N-type CNFET, a fourth N-type CNFET, a fifth N-type CNFET, a sixth N-type CNFET, a seventh CNFET, an eighth N-type CNFET and a ninth N-type CNFET; a power supply is accessed to a source of the first P-type CNFET, a source of the second P-type CNFET, a source of the third P-type CNFET and a source of the sixth P-type CNFET; a gate of the first P-type CNFET, a gate of the second P-type CNFET, a gate of the first N-type CNFET, a gate of the second N-type CNFET, a drain of the eighth N-type CNFET, a drain of the eighth P-type CNFET, a drain of the fourth P-type CNFET, a drain of the fifth P-type CNFET, a gate of the fifth P-type CNFET, a drain of the fourth N-type CNFET, a drain of the fifth N-type CNFET and the gate of the fifth N-type CNFET are connected; a drain of the first P-type CNFET, a drain of the first N-type CNFET, a gate of the third P-type CNFET, a gate of the fourth N-type CNFET and a gate of the sixth N-type CNFET are connected; a drain of the second P-type CNFET, a drain of the second N-type CNFET, a gate of the fourth P-type CNFET, a gate of the third N-type CNFET and a gate of the sixth P-type CNFET are connected; a drain of the third P-type CNFET, a source of the fourth P-type CNFET and a source of the fifth P-type CNFET are connected; a drain of the sixth P-type CNFET, a drain of the sixth N-type CNFET, a drain of the seventh P-type CNFET and a drain of the seventh N-type CNFET are connected; a gate of the seventh P-type CNFET is connected to the inverted read word line; a source of the seventh P-type CNFET and a source of the seventh N-type CNFET are connected to the read bit line; a gate of the eighth P-type CNFET is connected to the inverted column select bit line; a source of the eighth P-type CNFET, a source of the eighth N-type CNFET, a drain of the ninth P-type CNFET and a drain of the ninth N-type CNFET are connected; a gate of the ninth P-type CNFET is connected to the inverted write word line; a source of the ninth P-type CNFET and a source of the ninth N-type CNFET are connected to the write bit line; a source of the first N-type CNFET, a source of the second N-type CNFET, a source of the third N-type CNFET and a source of the sixth N-type CNFET are all grounded; a drain of the third N-type CNFET, a source of the fourth N-type CNFET and a source of the fifth N-type CNFET are connected; a gate of the seventh N-type CNFET is connected to the read word line; a gate of the eighth N-type CNFET is connected to the column select bit line; and a gate of the ninth N-type CNFET is connected to the write word line.

The first P-type CNFET has a chirality vector of (10, 0), the second P-type CNFET has a chirality vector of (19, 0), the third P-type CNFET has a chirality vector of (13, 0), the fourth P-type CNFET has a chirality vector of (13, 0), the fifth P-type CNFET has a chirality vector of (13, 0), the sixth P-type CNFET has a chirality vector of (13, 0), the seventh P-type CNFET has a chirality vector of (19, 0), the eighth P-type CNFET has a chirality vector of (19, 0), the ninth P-type CNFET has a chirality vector of (19, 0), the first N-type CNFET has a chirality vector of (28, 0), the second N-type CNFET has a chirality vector of (8, 0), the third N-type CNFET has a chirality vector of (13, 0), the fourth N-type CNFET has a chirality vector of (13, 0), the fifth N-type CNFET has a chirality vector of (13, 0), the sixth N-type CNFET has a chirality vector of (13, 0), the seventh N-type CNFET has a chirality vector of (19, 0), the eighth N-type CNFET has a chirality vector of (19, 0), and the ninth N-type CNFET has a chirality vector of (19, 0).

Compared with the prior art, the invention has the following beneficial effects: the ternary SRAM cell is formed by the write bit line, the read bit line, the column select bit line, the inverted column select bit line, the write word line, the inverted write word line, the read word line, the inverted read word line, the first P-type CNFET, a second P-type CNFET, a third P-type CNFET, a fourth P-type CNFET, a fifth P-type CNFET, a sixth P-type CNFET, a seventh P-type CNFET, an eighth P-type CNFET, a ninth P-type CNFET, a first N-type CNFET, a second N-type CNFET, a third N-type CNFET, a fourth N-type CNFET, a fifth N-type CNFET, a sixth N-type CNFET, a seventh CNFET, an eighth N-type CNFET and a ninth N-type CNFET, wherein, the seventh P-type CNFET and the seventh N-type CNFET form a read transmission gate, the ninth N-type CNFET and the ninth P-type CNFET form a write transmission gate, the sixth P-type CNFET and the sixth N-type CNFET form a read buffer, and the eighth P-type CNFET and the eighth N-type CNFET form a column select transmission gate; the first P-type CNFET, the second P-type CNFET, the third P-type CNFET, the fourth P-type CNFET, the fifth P-type CNFET, the first N-type CNFET, the second N-type CNFET, the third N-type CNFET, the fourth N-type CNFET and the fifth N-type CNFET form a basic memory cell used for maintaining logic values '0', '1' and '2'; in the basic memory cell, the first N-type CNFET, the second N-type CNFET, the first P-type CNFET and the second P-type CNFET are used for converting a ternary signal into two binary signals; the third P-type CNFET, the fourth P-type CNFET, the fifth P-type CNFET, the third N-type CNFET, the fourth N-type CNFET and the fifth N-type CNFET are used for converting two binary signals into a ternary signal; the read transmission gate is connected to the read bit line and is used for read operations; the write gate transmission gate is connected to the write bit line and is used for write operations; a connection node of the drain of the first P-type CNFET, the drain of the first N-type CNFET, the gate of the third P-type CNFET, the gate of the fourth N-type CNFET and the gate of the sixth N-type CNFET is marked as Q1; a connection node of the drain of the second P-type CNFET, the drain of the second N-type CNFET, the gate of the fourth P-type CNFET, the gate of the third N-type CNFET and the gate of the sixth P-type CNFET is marked as Q2; a connecting node of the gate of the first P-type CNFET, the gate of the second P-type CNFET, the gate of the first N-type CNFET, the gate of the second N-type CNFET, the drain of the eighth N-type CNFET, the drain of the eighth P-type CNFET, the drain of the fourth P-type CNFET, the drain of the fifth P-type CNFET, the gate of the fifth P-type CNFET, the drain of the fourth N-type CNFET, the drain of the fifth N-type CNFET and the gate of the fifth N-type CNFET is marked as Q3, and Q3 is a memory node; when logic '1' is stored, there is only one DC path formed by the third P-type CNFET, the fifth P-type CNFET, the fifth N-type CNFET and the third N-type CNFET, the drain and gate of the fifth P-type CNFET are in short connection with the drain and gate of the fifth N-type CNFET, and the fifth P-type CNFET and the fifth N-type CNFET are in series connection with the third N-type CNFET and the third P-type CNFET, so that a very small direct current is generated, and thus, the ternary SRAM cell has an ultralow leakage power; the write operation is executed by the write transmission gate and the column select transmission gate and is controlled by the write word line WWL, the inverted write word line WWLB, the column select bit line CSL and the inverted column select bit line CSLB, so that when WWL and CSL are both at a high level and WWLB and CSLB are both at a low level, the write transmission gate and the column select transmission gate are turned on, and data on WBL are written into a selected SRAM cell circuit; because the non-selected column select transmission gate in the selected word line is turned off, the state of the memory nodes of the cell will not be affected by values on WBL, and the half-select problem is completely eliminated; the read operation is executed by the read buffer and the read transmission gate and is controlled by the voltage of node Q1, the voltage of node Q2, the read word line RWL and the inverted read word line RWLB, the read bit line RBL is charged to logic level VDD/2 before the read operation is performed, and the logic level on node Q3 is transmitted by the read buffer onto RBL when RWL is at a high level and RWLB is at a low level; due to the fact that the memory node Q3 is separated from the read bit line RBL, Q3 is not affected by data on RBL, and accordingly, the read-disturb problem is completely eliminated, and the stability of the memory is improved. In this way, the ternary SRAM cell fulfills data access in a read-write separated manner, thereby being low in power consumption, capable of solving the half-select problem and the read-disturb problem and high in static noise margin.

DETAILED DESCRIPTION OF THE INVENTION

The invention is further expounded below with reference to the accompanying drawings and embodiments.

Embodiment 1

Figure 1:
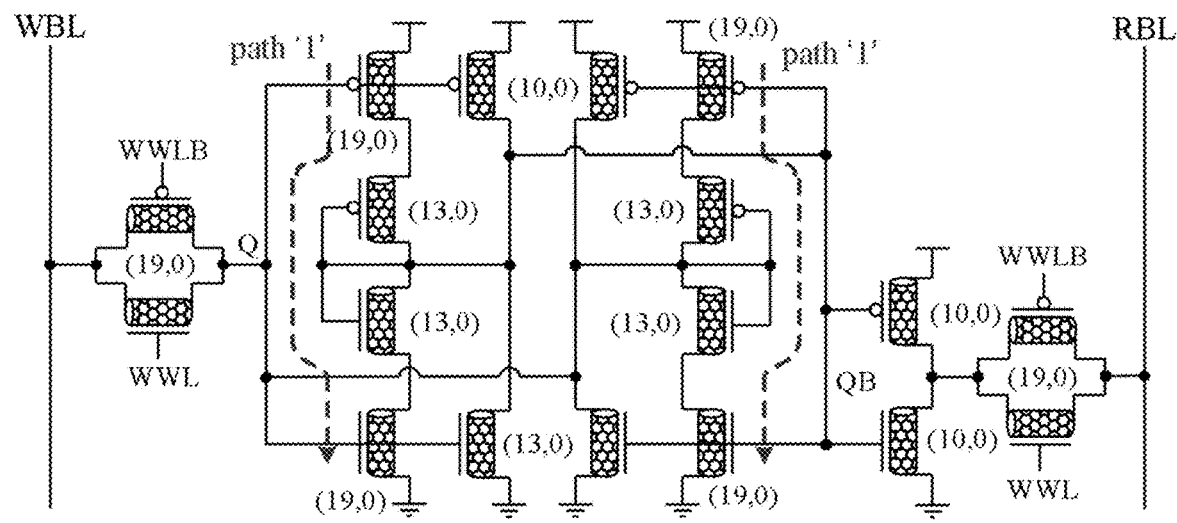
FIG. 1 is a circuit diagram of a traditional ternary SRAM cell in the prior art.
Figure 2:
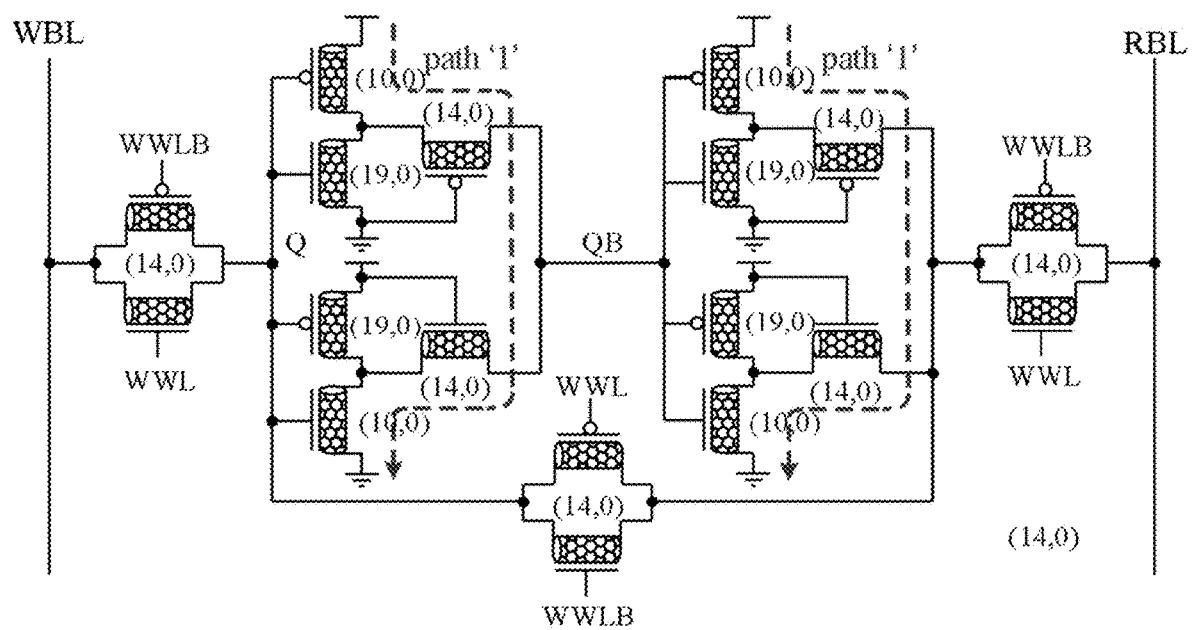
FIG. 2 is a circuit diagram of a novel ternary SRAM cell in the prior art.
Figure 3:
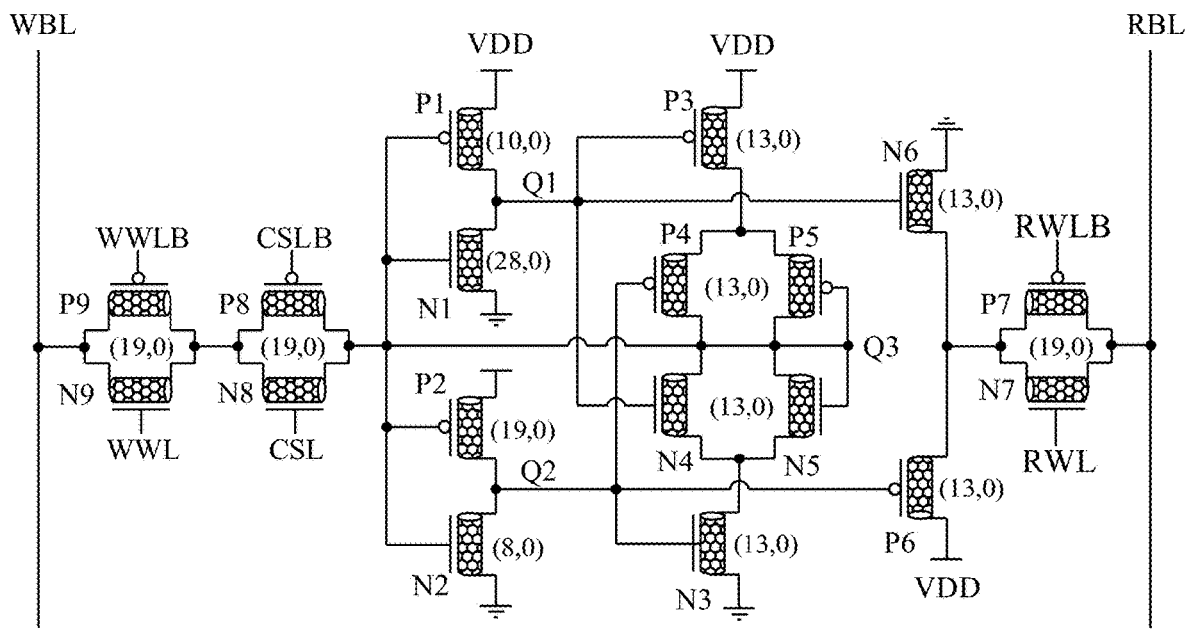
FIG. 3 is a circuit diagram of a ternary SRAM cell of the invention.

As shown in FIG. 3, a carbon nanotube ternary SRAM cell with an improved stability and low standby power comprises a write bit line WBL, a read bit line RBL, a column select bit line CSL, an inverted column select bit line CSLB, a write word line WWL, an inverted write word line WWLB, a read word line RWL, an inverted read word line RWLB, a first P-type CNFET P1, a second P-type CNFET P2, a third P-type CNFET P3, a fourth P-type CNFET P4, a fifth P-type CNFET P5, a sixth P-type CNFET P6, a seventh P-type CNFET P7, an eighth P-type CNFET P8, a ninth P-type CNFET P9, a first N-type CNFET N1, a second N-type CNFET N2, a third N-type CNFET N3, a fourth N-type CNFET N4, a fifth N-type CNFET N5, a sixth N-type CNFET N6, a seventh CNFET N7, an eighth N-type CNFET N8 and a ninth N-type CNFET N9; a power supply VDD is accessed to a source of the first P-type CNFET P1, a source of the second P-type CNFET P2, a source of the third P-type CNFET P3 and a source of the sixth P-type CNFET P6; a gate of the first P-type CNFET P1, a gate of the second P-type CNFET P2, a gate of the first N-type CNFET N1, a gate of the second N-type CNFET N2, a drain of the eighth N-type CNFET N8, a drain of the eighth P-type CNFET P8, a drain of the fourth P-type CNFET P4, a drain of the fifth P-type CNFET P5, a gate of the fifth P-type CNFET P5, a drain of the fourth N-type CNFET N4, a drain of the fifth N-type CNFET N5 and the gate of the fifth N-type CNFET N5 are connected; a drain of the first P-type CNFET P1, a drain of the first N-type CNFET N1, a gate of the third P-type CNFET P3, a gate of the fourth N-type CNFET N4 and a gate of the sixth N-type CNFET N6 are connected; a drain of the second P-type CNFET P2, a drain of the second N-type CNFET N2, a gate of the fourth P-type CNFET P4, a gate of the third N-type CNFET N3 and a gate of the sixth P-type CNFET P6 are connected; a drain of the third P-type CNFET P3, a source of the fourth P-type CNFET P4 and a source of the fifth P-type CNFET P5 are connected; a drain of the sixth P-type CNFET P6, a drain of the sixth N-type CNFET N6, a drain of the seventh P-type CNFET P7 and a drain of the seventh N-type CNFET N7 are connected; a gate of the seventh P-type CNFET P7 is connected to the inverted read word line RWLB; a source of the seventh P-type CNFET P7 and a source of the seventh N-type CNFET N7 are connected to the read bit line RBL; a gate of the eighth P-type CNFET P8 is connected to the inverted column select bit line CSLB; a source of the eighth P-type CNFET P8, a source of the eighth N-type CNFET N8, a drain of the ninth P-type CNFET P9 and a drain of the ninth N-type CNFET N9 are connected; a gate of the ninth P-type CNFET P9 is connected to the inverted write word line WWLB; a source of the ninth P-type CNFET P9 and a source of the ninth N-type CNFET N9 are connected to the write bit line WBL; a source of the first N-type CNFET N1, a source of the second N-type CNFET N2, a source of the third N-type CNFET N3 and a source of the sixth N-type CNFET N6 are all grounded; a drain of the third N-type CNFET N3, a source of the fourth N-type CNFET N4 and a source of the fifth N-type CNFET N5 are connected; a gate of the seventh N-type CNFET N7 is connected to the read word line RWL; a gate of the eighth N-type CNFET N8 is connected to the column select bit line CSL; and a gate of the ninth N-type CNFET N9 is connected to the write word line WWL.

Embodiment 2

As shown in FIG. 3, a carbon nanotube ternary SRAM cell with an improved stability and low standby power comprises a write bit line WBL, a read bit line RBL, a column select bit line CSL, an inverted column select bit line CSLB, a write word line WWL, an inverted write word line WWLB, a read word line RWL, an inverted read word line RWLB, a first P-type CNFET P1, a second P-type CNFET P2, a third P-type CNFET P3, a fourth P-type CNFET P4, a fifth P-type CNFET P5, a sixth P-type CNFET P6, a seventh P-type CNFET P7, an eighth P-type CNFET P8, a ninth P-type CNFET P9, a first N-type CNFET N1, a second N-type CNFET N2, a third N-type CNFET N3, a fourth N-type CNFET N4, a fifth N-type CNFET N5, a sixth N-type CNFET N6, a seventh N-type CNFET N7, an eighth N-type CNFET N8 and a ninth N-type CNFET N9; a power supply VDD is accessed to a source of the first P-type CNFET P1, a source of the second P-type CNFET P2, a source of the third P-type CNFET P3 and a source of the sixth P-type CNFET P6; a gate of the first P-type CNFET P1, a gate of the second P-type CNFET P2, a gate of the first N-type CNFET N1, a gate of the second N-type CNFET N2, a drain of the eighth N-type CNFET N8, a drain of the eighth P-type CNFET P8, a drain of the fourth P-type CNFET P4, a drain of the fifth P-type CNFET P5, a gate of the fifth P-type CNFET P5, a drain of the fourth N-type CNFET N4, a drain of the fifth N-type CNFET N5 and the gate of the fifth N-type CNFET N5 are connected; a drain of the first P-type CNFET P1, a drain of the first N-type CNFET N1, a gate of the third P-type CNFET P3, a gate of the fourth N-type CNFET N4 and a gate of the sixth N-type CNFET N6 are connected; a drain of the second P-type CNFET P2, a drain of the second N-type CNFET N2, a gate of the fourth P-type CNFET P4, a gate of the third N-type CNFET N3 and a gate of the sixth P-type CNFET P6 are connected; a drain of the third P-type CNFET P3, a source of the fourth P-type CNFET P4 and a source of the fifth P-type CNFET P5 are connected; a drain of the sixth P-type CNFET P6, a drain of the sixth N-type CNFET N6, a drain of the seventh P-type CNFET P7 and a drain of the seventh N-type CNFET N7 are connected; a gate of the seventh P-type CNFET P7 is connected to the inverted read word line RWLB; a source of the seventh P-type CNFET P7 and a source of the seventh N-type CNFET N7 are connected to the read bit line RBL; a gate of the eighth P-type CNFET P8 is connected to the inverted column select bit line CSLB; a source of the eighth P-type CNFET P8, a source of the eighth N-type CNFET N8, a drain of the ninth P-type CNFET P9 and a drain of the ninth N-type CNFET N9 are connected; a gate of the ninth P-type CNFET P9 is connected to the inverted write word line WWLB; a source of the ninth P-type CNFET P9 and a source of the ninth N-type CNFET N9 are connected to the write bit line WBL; a source of the first N-type CNFET N1, a source of the second N-type CNFET N2, a source of the third N-type CNFET N3 and a source of the sixth N-type CNFET N6 are all grounded; a drain of the third N-type CNFET N3, a source of the fourth N-type CNFET N4 and a source of the fifth N-type CNFET N5 are connected; a gate of the seventh N-type CNFET N7 is connected to the read word line RWL; a gate of the eighth N-type CNFET N8 is connected to the column select bit line CSL; and a gate of the ninth N-type CNFET N9 is connected to the write word line WWL.

In this embodiment, the first P-type CNFET P1 has a chirality vector of (10, 0), the second P-type CNFET P2 has a chirality vector of (19, 0), the third P-type CNFET P3 has a chirality vector of (13, 0), the fourth P-type CNFET P4 has a chirality vector of (13, 0), the fifth P-type CNFET P5 has a chirality vector of (13, 0), the sixth P-type CNFET P6 has a chirality vector of (13, 0), the seventh P-type CNFET P7 has a chirality vector of (19, 0), the eighth P-type CNFET P8 has a chirality vector of (19, 0), the ninth P-type CNFET P9 has a chirality vector of (19, 0), the first N-type CNFET N1 has a chirality vector of (28, 0), the second N-type CNFET N2 has a chirality vector of (8, 0), the third N-type CNFET N3 has a chirality vector of (13, 0), the fourth N-type CNFET N4 has a chirality vector of (13, 0), the fifth N-type CNFET N5 has a chirality vector of (13, 0), the sixth N-type CNFET N6 has a chirality vector of (13, 0), the seventh N-type CNFET N7 has a chirality vector of (19, 0), the eighth N-type CNFET N8 has a chirality vector of (19, 0), and the ninth N-type CNFET N9 has a chirality vector of (19, 0).

In this embodiment, the seventh P-type CNFET P7 and the seventh N-type CNFET N7 form a read transmission gate, the ninth N-type CNFET N9 and the ninth P-type CNFET P9 form a write transmission gate, the sixth P-type CNFET P6 and the sixth N-type CNFET N6 form a read buffer, and the eighth P-type CNFET P8 and the eighth N-type CNFET N8 form a column select transmission gate; the first P-type CNFET P1, the second P-type CNFET P2, the third P-type CNFET P3, the fourth P-type CNFET P4, the fifth P-type CNFET P5, the first N-type CNFET N1, the second N-type CNFET N2, the third N-type CNFET N3, the fourth N-type CNFET N4 and the fifth N-type CNFET N5 form a basic memory cell used for maintaining logic values '0', '1' and '2'; in the basic memory cell, the first N-type CNFET N1, the second N-type CNFET N2, the first P-type CNFET P1 and the second P-type CNFET P2 forms a binary conversion circuit 1T-2B used for converting a ternary signal into two binary signals; the third P-type CNFET P3, the fourth P-type CNFET P4, the fifth P-type CNFET P5, the third N-type CNFET N3, the fourth N-type CNFET N4 and the fifth N-type CNFET N5 form a ternary conversion circuit 2B-1T used for converting two binary signals into a ternary signal; the read transmission gate is connected to the read bit line and is used for read operations; the write gate transmission gate is connected to the write bit line and is used for write operations; a connection node of the drain of the first P-type CNFET P1, the drain of the first N-type CNFET N1, the gate of the third P-type CNFET P3, the gate of the fourth N-type CNFET N4 and the gate of the sixth N-type CNFET N6 is marked as Q1; a connection node of the drain of the second P-type CNFET P2, the drain of the second N-type CNFET N2, the gate of the fourth P-type CNFET P4, the gate of the third N-type CNFET N3 and the gate of the sixth P-type CNFET P6 is marked as Q2; a connecting node of the gate of the first P-type CNFET P1, the gate of the second P-type CNFET P2, the gate of the first N-type CNFET N1, the gate of the second N-type CNFET N2, the drain of the eighth N-type CNFET N8, the drain of the eighth P-type CNFET P8, the drain of the fourth P-type CNFET P4, the drain of the fifth P-type CNFET P5, the gate of the fifth P-type CNFET P5, the drain of the fourth N-type CNFET N4, the drain of the fifth N-type CNFET N5 and the gate of the fifth N-type CNFET N5 is marked as Q3; Q3 is a memory node, and Q1 and Q2 are control nodes. When logic '0' is stored, the first P-type CNFET P1, the second P-type CNFET P2, the fifth P-type CNFET P5, the third N-type CNFET N3 and the fourth N-type CNFET N4 are turned on, the other CNFETs are turned off, node Q3 is kept at logic level 0, and at this moment, Q1=Q2=2, and Q3=0. When logic '2' is stored, the first N-type CNFET N1, the second N-type CNFET N2, the fifth N-type CNFET N5, the third P-type CNFET P3 and the fourth P-type CNFET P4 are turned on, the other CNFETs are turned off, and at the moment, Q1=Q2=0, Q3=2, and node Q3 is kept at logic level VDD. When logic '1' is stored, the first N-type CNFET N1, the third N-type CNFET N3, the fifth N-type CNFET N5, the second P-type CNFET P2, the third P-type CNFET P3 and the fifth P-type CNFET P5 are turned on, the other CNFETs are turned off, node Q3 is kept at logic level VDD/2, and at this moment, Q1=0, Q2=2, and Q3=1. Logic symbols and truth tables of 1T-2B and 2B-1T are shown in Table 1.

TABLE 1

| Logic symbols | | 1T-2B | | | 2B-1T | | |
|---|---|---|---|---|---|---|---|
| | | ternary | binary | | binary | | ternary |
| Voltage (V) | Logic value | Q3 | Q1 | Q2 | Q1 | Q2 | Q3 |
| 0 | 0 | 0 | 2 | 2 | 2 | 2 | 0 |
| 0.45 | 1 | 1 | 0 | 2 | 0 | 2 | 1 |
| 0.9 | 2 | 2 | 0 | 0 | 0 | 0 | 2 |

Figure 4:
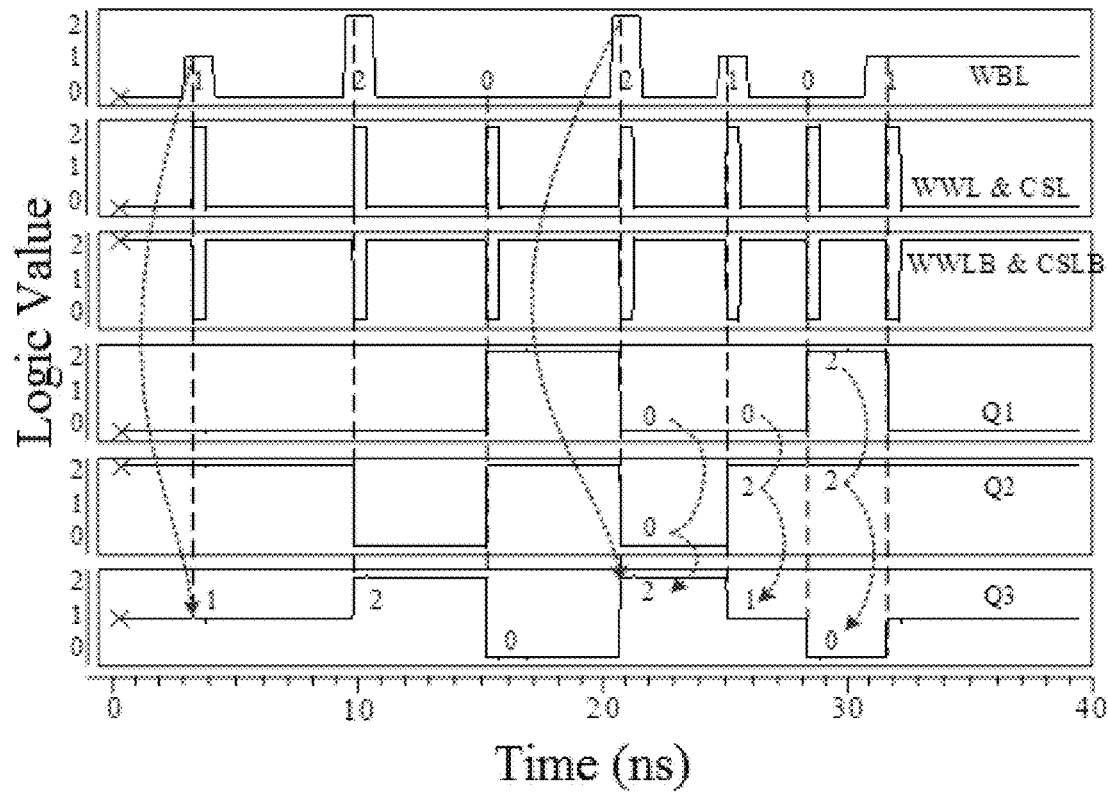
FIG. 4 is a simulation oscillogram of the write operation of the ternary SRAM cell of the invention.
Figure 5:
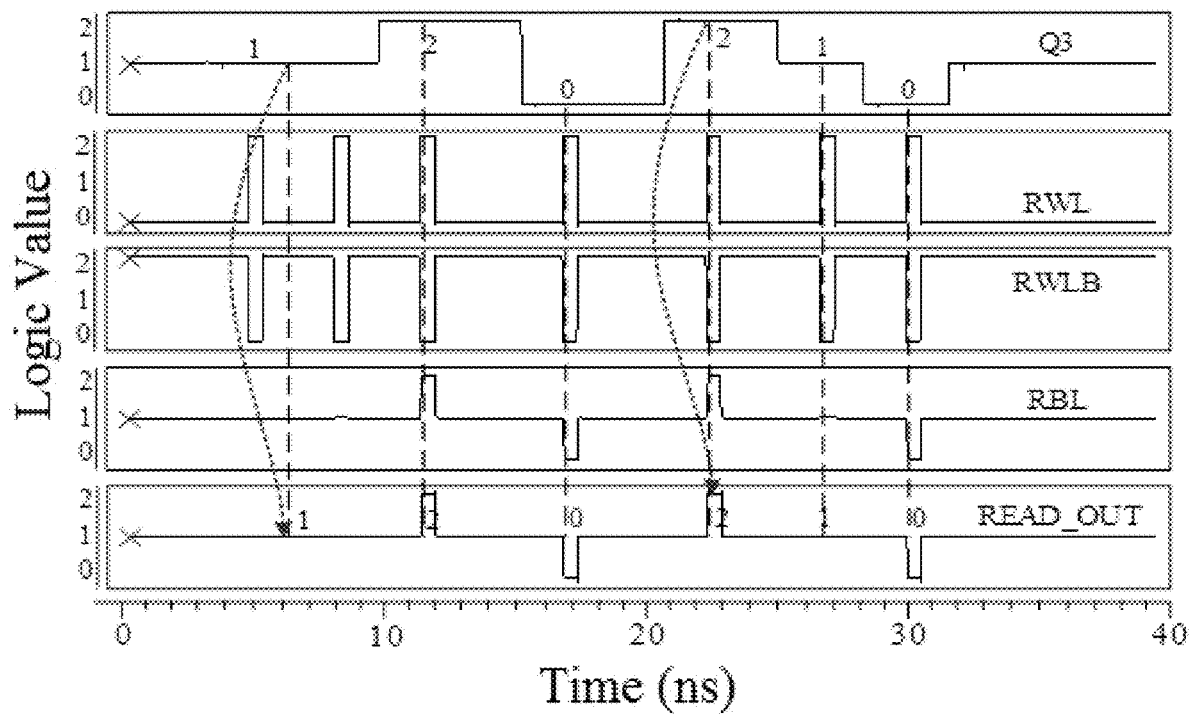
FIG. 5 is a simulation oscillogram of the read operation of the ternary SRAM cell of the invention.

Simulation of the ternary SRAM cell of the invention is carried out by HSPICE with the 32 nm CNFET standard model library designed by the Stanford University as a process library and a standard working voltage of 0.9V, and the voltages corresponding to logic value '0', logic value '1' and logic value '2' are separately 0V, 0.45V and 0.9V. To get close to the actual condition, a 1×128 ternary memory cell circuit array is used to test the ternary SRAM cell. FIG. 4 shows a simulation oscillogram of the write operation of the ternary SRAM cell of the invention, and FIG. 5 shows a simulation oscillogram of the read operation of the ternary SRAM cell of the invention. It can be known by analyzing FIG. 4 and FIG. 5 that the ternary SRAM cell of the invention has a correct write/read logic function.

Figure 6:
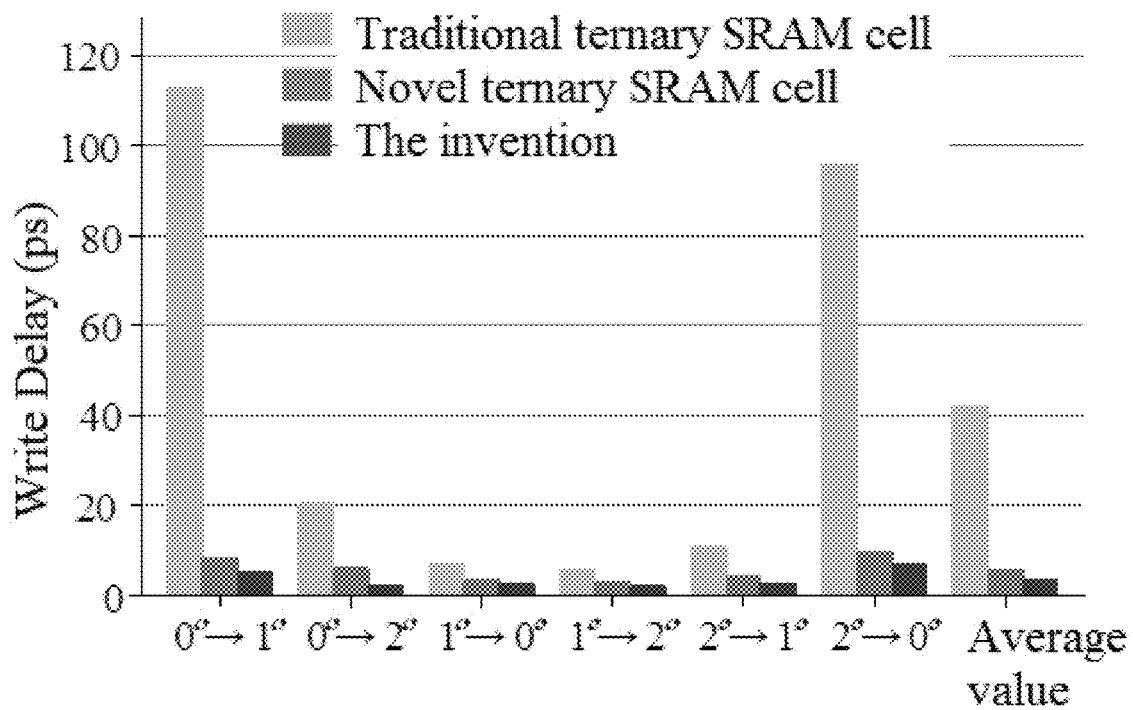
FIG. 6 is a statistical histogram of write delays of the ternary SRAM cell of the invention and the two ternary SRAM cells in the prior art.
Figure 7:
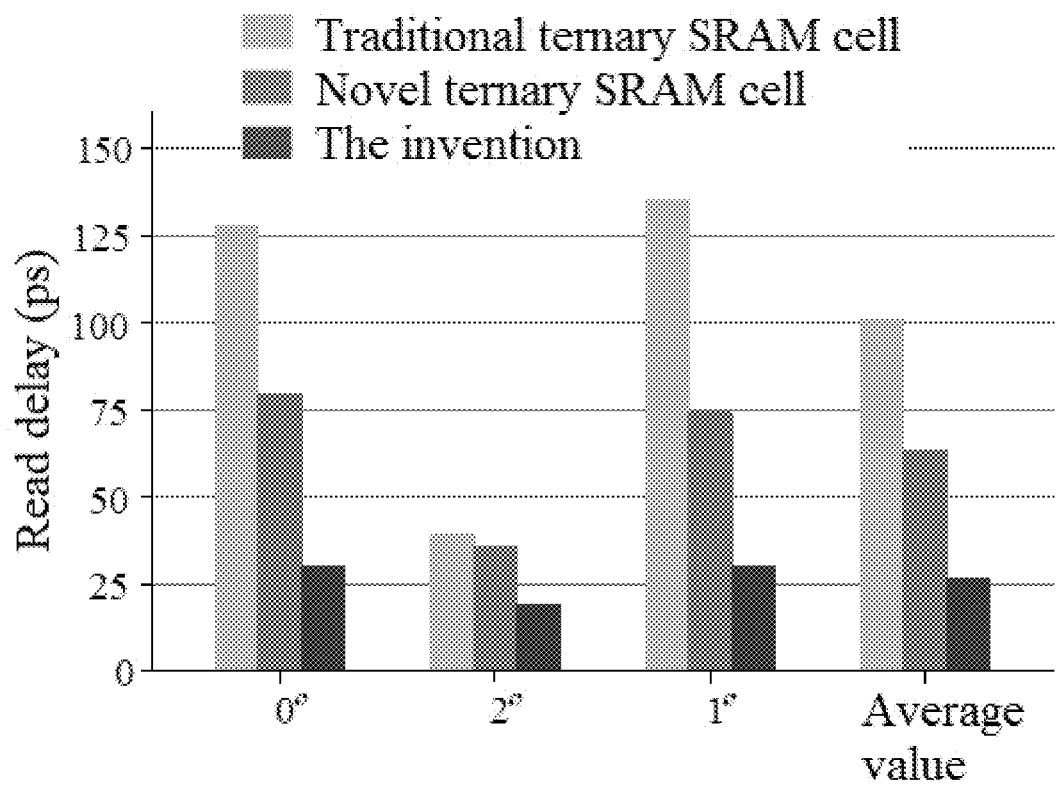
FIG. 7 is a statistical histogram of read delays of the ternary SRAM cell of the invention and the two ternary SRAM cells in the prior art.
Figure 8:
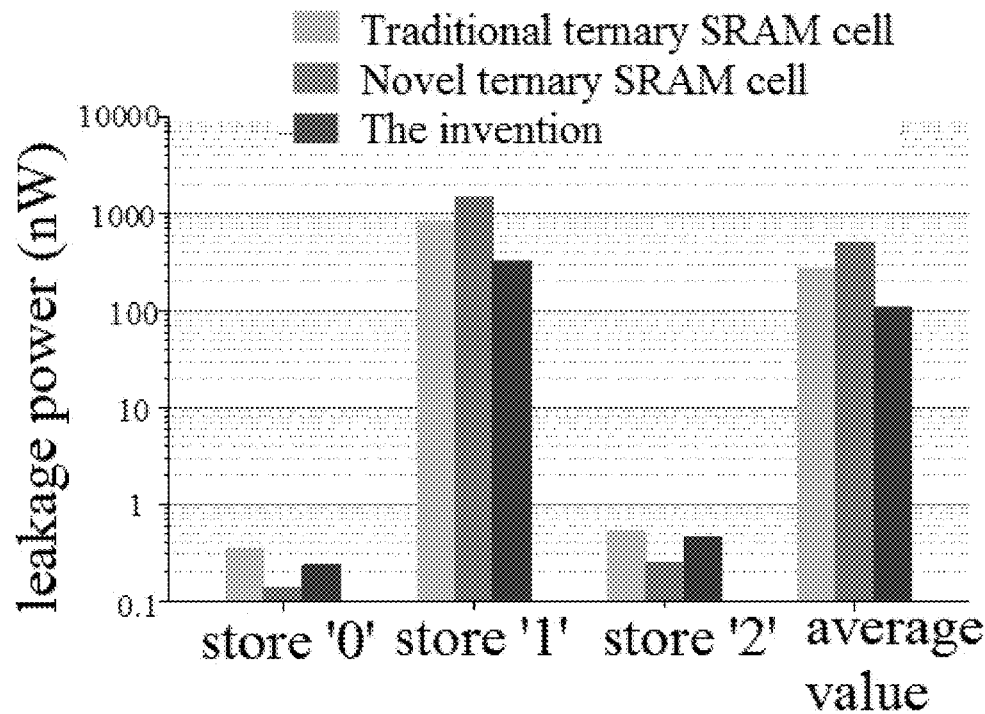
FIG. 8 is a statistical histogram of leakage powers of the ternary SRAM cell of the invention and the two ternary SRAM cells in the prior art.

FIG. 6 shows a statistical histogram of write delays of the ternary SRAM cell of the invention and the two ternary SRAM cells in the prior art, FIG. 7 shows a statistical histogram of read delays of the ternary SRAM cell of the invention and the two ternary SRAM cells in the prior art, and FIG. 8 shows a statistical histogram of the leakage powers of the ternary SRAM cell of the invention and the two ternary SRAM cells in the prior art. It can be known by analyzing FIGS. 6-8 that the novel ternary SRAM cell has smaller delays than the traditional ternary SRAM cell, and that compared with the novel ternary SRAM cell, the write delay and the read delay of the ternary SRAM cell of the invention are separately decreased by 39.6% and 58.2%. Compared with the traditional ternary SRAM cell, the average leakage power of the ternary SRAM cell is decreased by 60.5%; and compared with the novel ternary SRAM cell, the average leakage power of the ternary SRAM cell is decreased by 78.1%.

Figure 9:
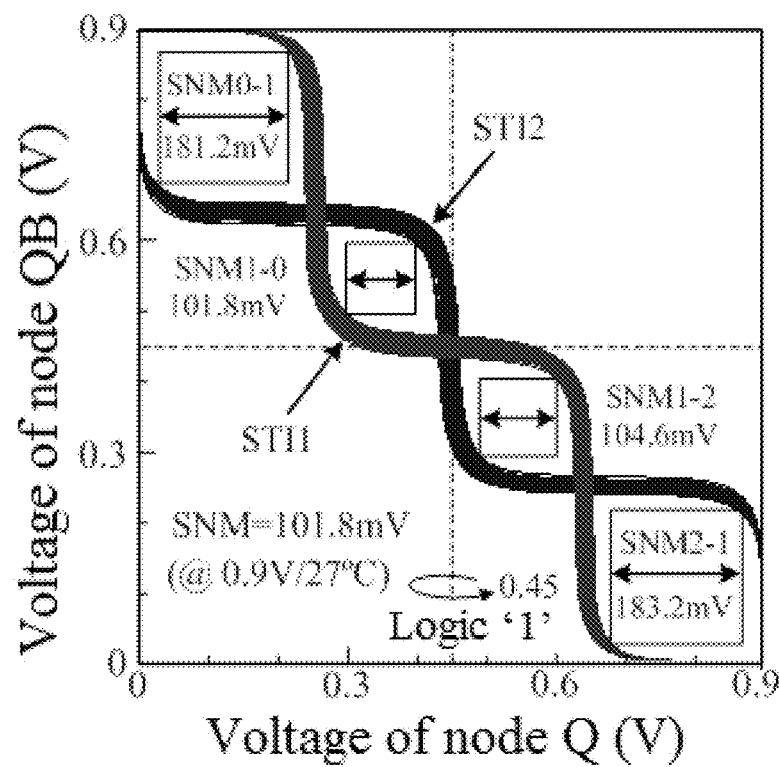
FIG. 9 is simulation diagram of the static noise margin of the traditional ternary SRAM cell in the prior art.
Figure 10:
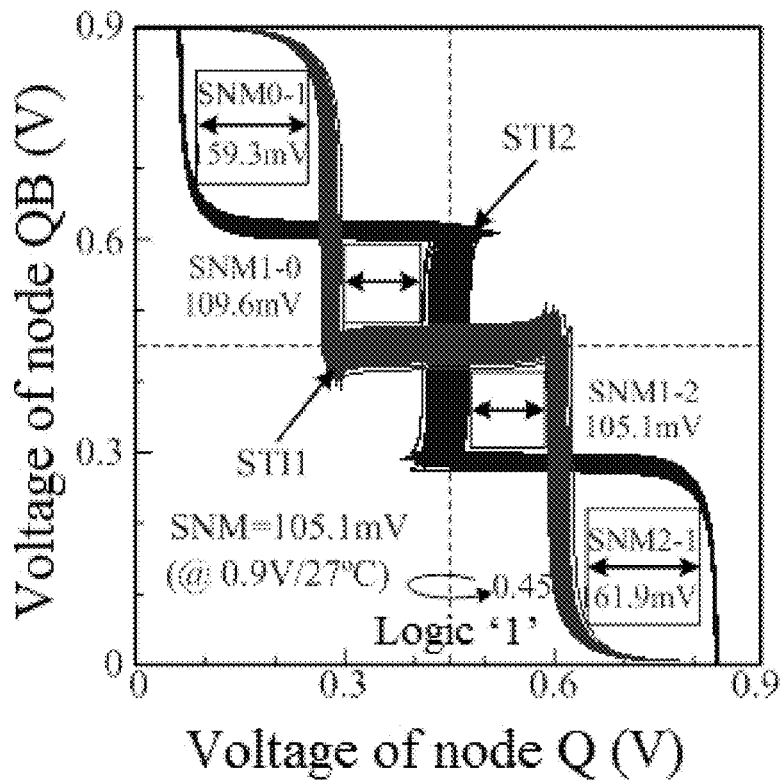
FIG. 10 is a simulation diagram of the static noise margin of the novel ternary SRAM cell in the prior art.
Figure 11:
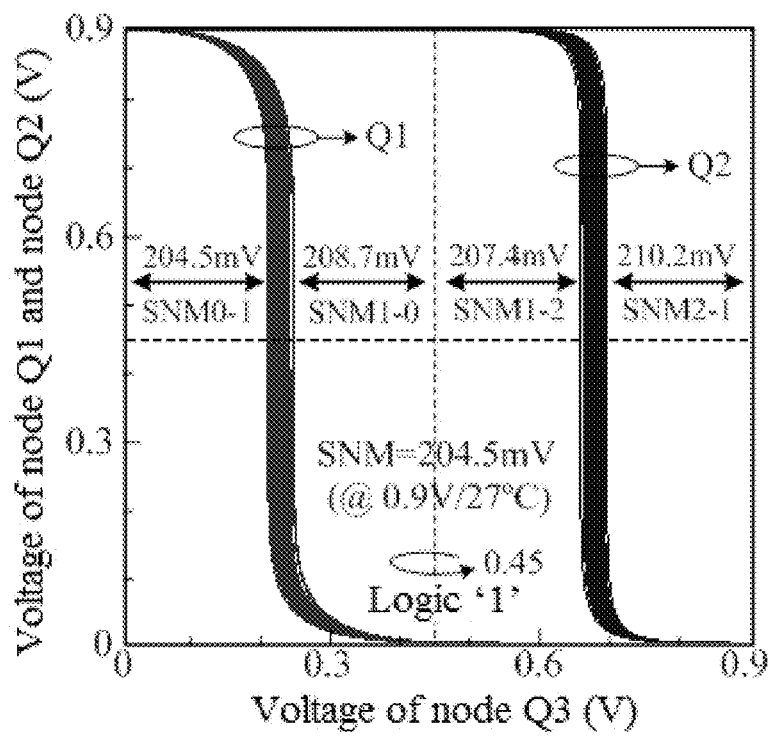
FIG. 11 is a simulation diagram of the static noise margin of the ternary SRAM cell of the invention.

Static noise margin (SNM) reflects the stability of SRAMs. The two ternary SRAM cells in the prior art are designed based on standard ternary inverters (STIs), and the SNM can be figured out according to the voltage transmission curve of a pair of STIs. However, as the SRAM cell in this application is not formed by STIs, SNM of the SRAM cell in this application cannot be obtained in this way. Because the state of node Q3 is controlled by the state of node Q1 and node Q2, and thus, the SNM of the ternary SRAM cell of the invention can be represented by the voltage of node Q3 when node Q1/Q2 jumps. FIG. 9 shows a simulation diagram of the static noise margin of the traditional ternary SRAM cell in the prior art, FIG. 10 shows a simulation diagram of the static noise margin of the novel ternary SRAM cell in the prior art, and FIG. 11 shows a simulation diagram of the static noise margin of the ternary SRAM cell of the invention. As can be seen from FIG. 11, the static stability region of the invention is almost divided into four parts (SNM0-1, SNM1-0, SNM1-2 and SNM2-1), and the SNM of the ternary SRAM cell of the invention is the minimum value of the four parts, namely SNM=MIN{SNM0-1, SNM1-0, SNM1-2, SNM2-1}, wherein SNM0-1 refers to the voltage of node Q3 when node Q1 jumps; SNM1-0 refers to the difference between the voltage corresponding to logic '1' and the voltage of node Q3 when node Q1 jumps, and SNM1-2 and SNM2-1 have analogous implications. As can be seen from FIG. 11, the SNM of the ternary SRAM cell of the invention is 204.5 mV and is separately 2.01 times and 1.95 times that of the traditional ternary SRAM cell (101.8 mV) and the novel ternary SRAM cell (105.1 mV).

The performance comparison of the ternary SRAM cell of the invention with the ternary SRAM cells in other relevant documents is shown in Table 2.

TABLE 2

| | | Documents | | | |
|---|---|---|---|---|---|
| | 3 | 4 | 1 | 2 | The invention |
| Process (nm) | CMOS 120 | CMOS 180 | CNFET 32 | CNFET 32 | CNFET 32 |
| Logic type | binary | binary | ternary | ternary | ternary | ternary |
| Supply voltage (V) | 1.2 | 1.2 | 1.8 | 0.9 | 0.9 | 0.9 |
| Number of transistors | 6 | 11 | 10 | 18 | 18 | 18 |
| Write delay (ps) '0'→'1' | x | x | 840 | 113.10 | 8.49 | 5.19 |
| '0'→'2' | 111 | 60 | 650 | 20.64 | 5.94 | 2.05 |
| '1'→'0' | x | x | 120 | 7.19 | 3.39 | 2.44 |
| '1'→'2' | x | x | 570 | 5.85 | 3.14 | 1.99 |
| '2'→'0' | 111 | 60 | 160 | 10.90 | 4.54 | 2.78 |
| '2'→'1' | x | x | 1230 | 95.91 | 9.82 | 6.89 |
| Avg. | 111 | 60 | 595 | 42.27 | 5.89 | 3.56 |
| Read delay (ps) '0' | 80 | 85 | 200 | 127.60 | 79.75 | 30.20 |
| '1' | x | x | 3900 | 39.00 | 35.85 | 19.38 |
| '2' | 80 | 14 | 165 | 135.30 | 74.25 | 30.10 |
| average value | 80 | 49.5 | 14212 | 100.63 | 63.28 | 26.44 |
| Leakage power (nW) '0' | N/A | N/A | N/A | 0.3515 | 0.1359 | 0.2334 |
| '1' | N/A | N/A | N/A | 828.7 | 1495.5 | 326.9 |
| '2' | N/A | N/A | N/A | 0.5104 | 0.2425 | 0.4538 |
| Avg. | N/A | N/A | N/A | 276.5 | 498.6 | 109.2 |
| Static noise margin (mV) | 195* | 395* | N/A | 101.8 | 105.1 | 204.5 |
| Having read-disturb problem or not | yes | no | yes | no | yes | no |
| Having half-select problem or not | yes | yes | yes | yes | yes | no |

In Table 2, x refers to nonexistence; N/A refers to unavailability, and * refers to simulation result in absence of process deviations. Document 3 refers to Prabhu C M R, Singh A K., Low-power fast (LPF) SRAM cell for write/read operation. IEICE Electron. Express, 2011, 8(18): 1473; and Document 4 refers to Kamar Z, Nepal K., Noise margin-optimized ternary CMOS SRAM delay and sizing characteristics. IEEE International Midwest Symposium on Circuits and Systems (MWSCAS), 2010: 801.

As can be seen from Table 2, the ternary SRAM cell of the invention is superior to the traditional ternary SRAM cell and the novel ternary SRAM cell in leakage power, read/write delay and SNM. The ternary SRAM cell of the invention separates the read operation from the write operation and thus solves the read-disturb problem; and non-selected columns are avoided, so that the half-select problem is also eliminated.

What is claimed is:

1. A carbon nanotube ternary SRAM cell with an improved stability and low standby power, comprising a write bit line, a read bit line, a column select bit line, an inverted column select bit line, a write word line, an inverted write word line, a read word line, an inverted read word line, a first P-type CNFET, a second P-type CNFET, a third P-type CNFET, a fourth P-type CNFET, a fifth P-type CNFET, a sixth P-type CNFET, a seventh P-type CNFET, an eighth P-type CNFET, a ninth P-type CNFET, a first N-type CNFET, a second N-type CNFET, a third N-type CNFET, a fourth N-type CNFET, a fifth N-type CNFET, a sixth N-type CNFET, a seventh CNFET, an eighth N-type CNFET and a ninth N-type CNFET, wherein a power supply is accessed to a source of the first P-type CNFET, a source of the second P-type CNFET, a source of the third P-type CNFET and a source of the sixth P-type CNFET; a gate of the first P-type CNFET, a gate of the second P-type CNFET, a gate of the first N-type CNFET, a gate of the second N-type CNFET, a drain of the eighth N-type CNFET, a drain of the eighth P-type CNFET, a drain of the fourth P-type CNFET, a drain of the fifth P-type CNFET, a gate of the fifth P-type CNFET, a drain of the fourth N-type CNFET, a drain of the fifth N-type CNFET and the gate of the fifth N-type CNFET are connected; a drain of the first P-type CNFET, a drain of the first N-type CNFET, a gate of the third P-type CNFET, a gate of the fourth N-type CNFET and a gate of the sixth N-type CNFET are connected; a drain of the second P-type CNFET, a drain of the second N-type CNFET, a gate of the fourth P-type CNFET, a gate of the third N-type CNFET and a gate of the sixth P-type CNFET are connected; a drain of the third P-type CNFET, a source of the fourth P-type CNFET and a source of the fifth P-type CNFET are connected; a drain of the sixth P-type CNFET, a drain of the sixth N-type CNFET, a drain of the seventh P-type CNFET and a drain of the seventh N-type CNFET are connected; a gate of the seventh P-type CNFET is connected to the inverted read word line; a source of the seventh P-type CNFET and a source of the seventh N-type CNFET are connected to the read bit line; a gate of the eighth P-type CNFET is connected to the inverted column select bit line; a source of the eighth P-type CNFET, a source of the eighth N-type CNFET, a drain of the ninth P-type CNFET and a drain of the ninth N-type CNFET are connected; a gate of the ninth P-type CNFET P9 is connected to the inverted write word line; a source of the ninth P-type CNFET and a source of the ninth N-type CNFET are connected to the write bit line; a source of the first N-type CNFET, a source of the second N-type CNFET, a source of the third N-type CNFET and a source of the sixth N-type CNFET are all grounded; a drain of the third N-type CNFET, a source of the fourth N-type CNFET and a source of the fifth N-type CNFET are connected; a gate of the seventh N-type CNFET is connected to the read word line; a gate of the eighth N-type CNFET is connected to the column select bit line; and a gate of the ninth N-type CNFET is connected to the write word line.

2. The carbon nanotube ternary SRAM cell with an improved stability and low standby power according to claim 1, wherein the first P-type CNFET has a chirality vector of (10, 0), the second P-type CNFET has a chirality vector of (19, 0), the third P-type CNFET has a chirality vector of (13, 0), the fourth P-type CNFET has a chirality vector of (13, 0), the fifth P-type CNFET has a chirality vector of (13, 0), the sixth P-type CNFET has a chirality vector of (13, 0), the seventh P-type CNFET has a chirality vector of (19, 0), the eighth P-type CNFET has a chirality vector of (19, 0), the ninth P-type CNFET has a chirality vector of (19, 0), the first N-type CNFET has a chirality vector of (28, 0), the second N-type CNFET has a chirality vector of (8, 0), the third N-type CNFET has a chirality vector of (13, 0), the fourth N-type CNFET has a chirality vector of (13, 0), the fifth N-type CNFET has a chirality vector of (13, 0), the sixth N-type CNFET has a chirality vector of (13, 0), the seventh N-type CNFET has a chirality vector of (19, 0), the eighth N-type CNFET has a chirality vector of (19, 0), and the ninth N-type CNFET has a chirality vector of (19, 0).

* * * * *